United States Patent [19]
Alfano et al.

[11] Patent Number: 4,931,704
[45] Date of Patent: Jun. 5, 1990

[54] ULTRAFAST SAMPLING OSCILLOSCOPE

[76] Inventors: Robert R. Alfano, 3777 Independence Ave., Bronx, N.Y. 10463; Ardie D. Walser, 1407 Linden Blvd., Apt. 13B, Brooklyn, N.Y. 11212

[21] Appl. No.: 281,679

[22] Filed: Dec. 9, 1988

[51] Int. Cl.⁵ .................. H01J 29/52; H01J 43/04; H01J 40/06; G01R 23/16
[52] U.S. Cl. .................. 315/384; 324/77 H; 313/532; 313/542
[58] Field of Search ............ 315/384, 367; 324/77 K, 324/77 H, 96; 350/355; 250/213 VT; 313/532, 542, 105 R

[56] References Cited
U.S. PATENT DOCUMENTS
4,434,399 2/1984 Mourou et al. .................. 324/96

Primary Examiner—Gregory C. Issing
Attorney, Agent, or Firm—Irving M. Kriegsman

[57] ABSTRACT

A femtosecond sampling oscilloscope includes a femtosecond laser for generating a pulse of light in the femtosecond range and a beam splitter for splitting the pulse of light into pulses traveling along first and second beam paths. A photoconductive switch disposed along the first beam path is used to produce an electrical stimulus output at a first output port, an electrical pulse output at a second output port and an optical output at a third output port. A photomultiplier tube having a strip line photocathode receives the pulse of light traveling along the first beam path. An input port is coupled to the photocathode. In use, the output signal at one of the output ports is connected to a test device producing a test voltage signal which is applied to the input port. When the test voltage signal and the light pulse traveling along the second path intersect on the photocathode in space and time, an electrical signal output is produced at the photomultiplier tube. The output is processed and/or stored in a computer and then, when desired, displayed on a cathode ray tube.

18 Claims, 5 Drawing Sheets

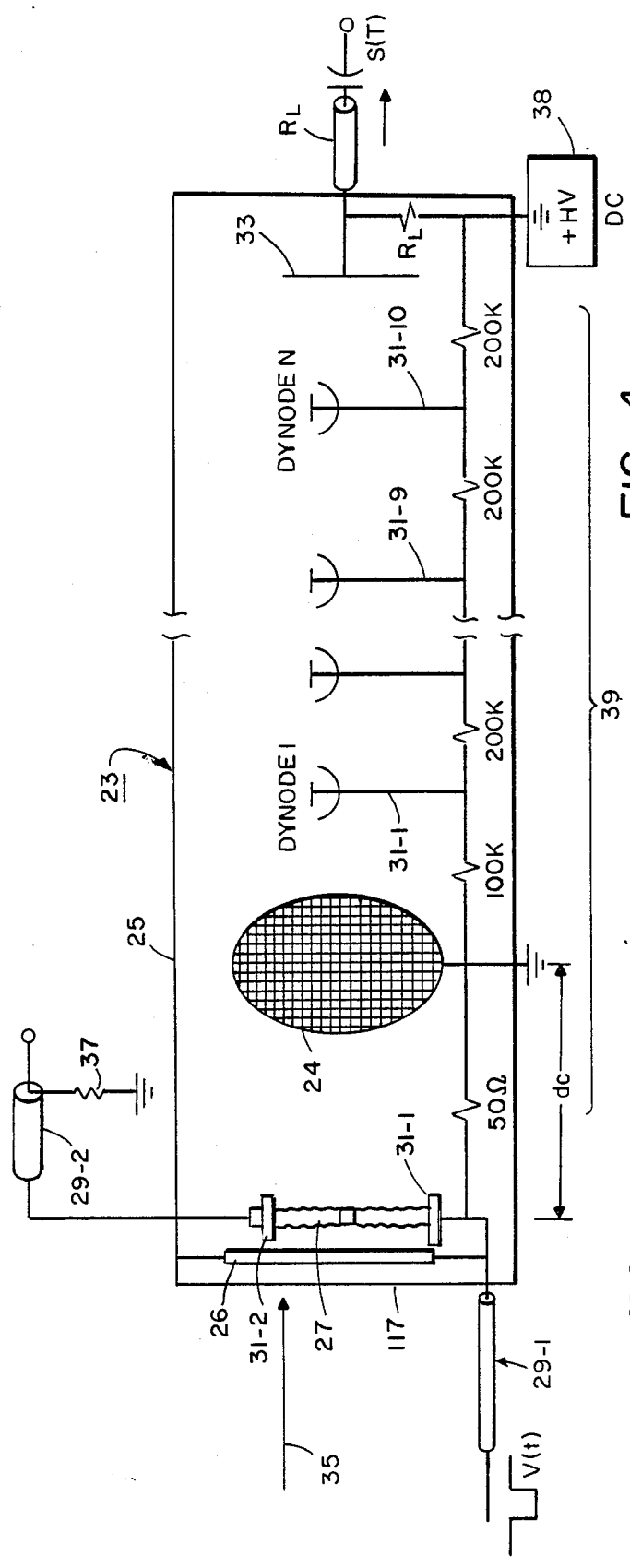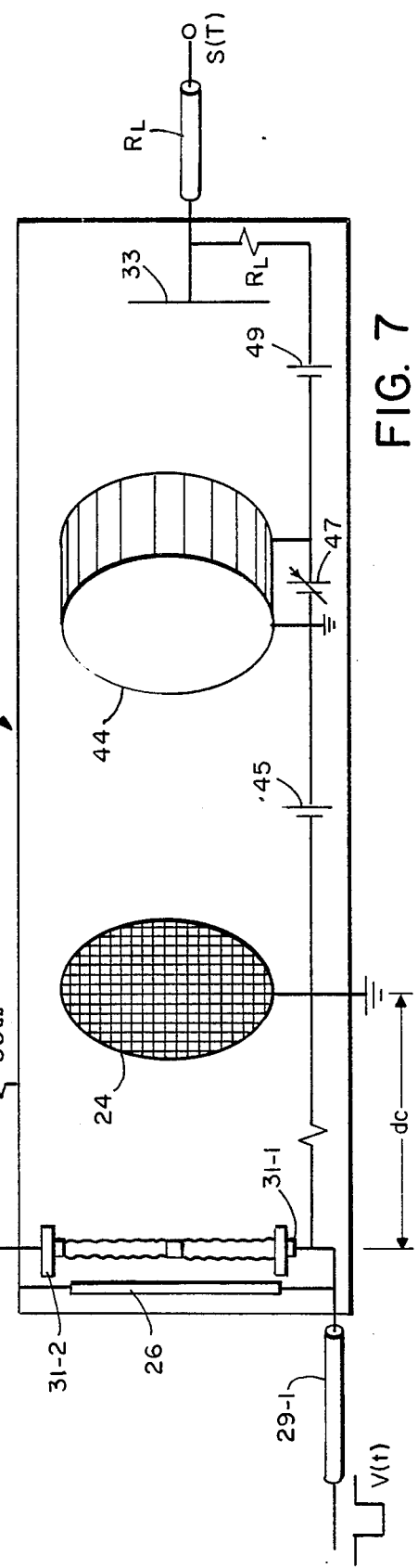
FIG. 4
FIG. 7

ULTRAFAST SAMPLING OSCILLOSCOPE

BACKGROUND OF THE INVENTION

This application is a continuation-in-part of patent 4,853,595, filed on Aug. 31, 1987 in the names of Robert R. Alfano and Ardie D. Walser.

The present invention relates generally to an ultrafast sampling oscilloscope and more particularly to an oscilloscope which includes a photomultiplier tube which is constructed and which possesses the sensitivity to time resolve a picosecond voltage pulse with femtosecond resolution.

An oscilloscope is a well known type of cathode ray tube device which produces a visible pattern which is the representation of an electrical input signal.

A photomultiplier tube is a well known type of photosensitive device that is commonly used in electro-optical systems to time resolve optical signals.

Basically, a photomultiplier tube comprises a photocathode, an electron multiplier and an anode, all disposed in an evacuated glass housing, with potential differences set up between the electrodes and the electron multiplier to cause photoelectrons emitted by the photocathode to pass through the electron multiplier and on to the anode.

When light strikes the photocathode, photoelectrons are emitted into the vacuum in proportion to the intensity of the light. These photoelectrons are multiplied by the electron multiplier and then collected by the anode as an output signal.

Because of the electron multiplication, photomultiplier tubes are uniquely sensitive among photosensitive devices currently used to detect radiant energy in the ultraviolet, visible, and near infrared regions. Photomultiplier tubes also feature relatively fast time response and low noise.

The photocathode in a photomultiplier tube is generally arranged in either a side-on or a head-on configuration. In the side-on type configuration a generally circularly shaped photocathode receives incident light through the side of the glass housing while, in the head-on type, a generally cylindrically shaped photocathode receives light through the end of the glass housing. In general, the side-on type photomultiplier tube is widely used for spectrophotometers and general photometric systems. Most of the side-on types employ an opaque photocathode (reflection-mode photocathode) and a circular-cage structure electron multiplier which has good sensitivity and high amplification at relatively low supply voltage.

The head-on type photomultiplier tube has a semitransparent photocathode (transmission-mode photocathode) deposited upon the inner surface of the entrance window while in the side-on type, the photocathode is a separate structure. Because the head-on type provides better uniformity and lower noise, it is frequently used in a scintillation detection and photon counting applications.

The electron multiplier in a photomultiplier tube is usually either a series of electrodes, called dynodes, or a microchannel plate. As is known, a microchannel plate (MCP) is a form of secondary electron multiplier consisting of an array of millions of glass capillaries (channels) having an internal diameter ranging from 10 um to 20 um fused into the form of a thin disk less than 1 mm thick. The inside wall of each channel is coated with a secondary electron emissive material having a proper resistance and both ends of the channel are covered with a metal thin film which act as electrodes. Thus, each channel becomes an independent secondary electron multiplier.

When a voltage is applied between both sides of an MCP, an electric field is generated in the direction of the channel axis. When an electron hits the entrance wall of the channel, secondary electrons are produced. These secondary electrons are accelerated by the electric field and travel along parabolic trajectories determined by their initial velocity. Then they strike the opposite wall and produce other secondary electrons. This process is repeated many times along the channel and, as a result, the electron current increases exponentially towards the output end of the channel.

In an article entitled High Speed Electrical Sampling by Photomission in Appl. Phys. Lett. 49(6) 11 Aug. 1986 by R. B. Marcus et al pages 357–359 there is disclosed a method for contactless temporal sampling of high speed electrical signals using spectral analysis of photoelectrons emitted when a signal-carrying conductor is illuminated by ultrashort light pulses.

In an article entitled High Speed Circuit Measurements Using Photoemission Sampling in Appl. Phys. Lett. 49, (4) 28 July 1986, pages 226–228 by J. Bokor et al there is disclosed a method for measuring voltage waveforms on metallization lines of an integrated circuit or an electronic device which is capable of picosecond resolution.

In U.S. Pat. No. 3,885,178 to Goehner there is disclosed a photomultiplier tube (PMT) which converts a received light signal to an output electrical signal of substantially greater intensity by employing a photocathode to convert incident light to free electrons, a plural dynode accelerating structure for effectively multiplying the free electrons, and an impact ionization diode (IID) for further multiplying and collecting the free electrons to provide a corresponding electrical output signal. The PMT can be an electrostatic device, in which the photocathode and the dynodes are mounted in opposed staggered positions, or a static crossed field device, in which the photocathode and the dynodes all are mounted opposite an accelerating rail and a magnetic field is provided to urge the electrons laterally along the tube. The IID's junction is reversed biased and the entire diode is maintained at a substantially higher potential than the last dynode. The PMT can be gain controlled or turned off without affecting dynode potentials by controlling the IID's potential. Due to the gain provided by the IID, dynode current can be greatly reduced, thereby increasing substantially the life of the tube without affecting its overall gain.

Known patents of interest include U.S. Pat. No. 3,867,662 to Endriz; U.S. Pat. No. 3,914,136 to Kressel; U.S. Pat. No. 4,467,189 to Tsuchiya and U.S. Pat. No. 4,659,921 to Alfano.

One of the limitations of most prior art photomultiplier tubes is that although they have a relatively fast time response, they are not capable of time resolving events in the picosecond or femtosecond range.

It is an object of the present invention to provide an ultrafast sampling oscilloscope.

It is an object of this invention to provide an oscilloscope which is capable of time resolving picosecond test voltage pulses with femtosecond resolution.

It is still another object of the present invention to provide an oscilloscope which employs a photomultiplier tube which is constructed and which possesses the sensitivity to time resolve a picosecond voltage pulse with femtosecond resolution.

SUMMARY OF THE INVENTION

A sampling oscilloscope capable of time resolving a picosecond voltage pulse from a test device with femtosecond resolution constructed according to the teachings of the present invention comprises means for generating a femtosecond pulse of light, means for splitting the pulse of light into light pulses traveling along a plurality of beam paths, means disposed along one of the beam path for generating a signal which may be applied to the test device to produce the picosecond voltage pulse signal, a photomultiplier tube constructed to include a photocathode having a transmission line configuration, an accellerating mesh, electron multiplication means, an anode and means negatively biasing said accellerating mesh relative to said anode, the light traveling along another beam path striking the photocathode, the picosecond voltage pulse from the test device being applied to the photocathode through an input port so as negatively bias the photocathode relative to the accellerating mesh beginning at a time t, whereby electrons proportional in number to the amplitude of the output signal from the test device will be emitted from the photocathode in the photomultiplier tube and thereafter amplified and transmitted to the anode in the photomultiplier tube only during the period of time t in which the test pulse is biasing the photocathode as light is impinging thereon and means for displaying the output signal at the anode of the photomultiplier tube.

Various features and objects will appear from the description to follow. In the description, reference is made to the accompanying drawing which forms a part thereof, and in which is shown by way of illustration, specific embodiments for practicing the invention. These embodiments will be described in sufficient detail to enable those skilled in the art to practice the invention, and it is to be understood that other embodiments may be utilized and that structural changes may be made without departing from the scope of the invention. The following detailed description is, therefore, not to be taken in a limiting sense, and the scope of the present invention is best defined by the appended claims.

BRIEF DESCRIPTION OF THE DRAWINGS

In the drawings wherein like reference numerals represent like parts:

FIG. 4 is a schematic diagram of the photomultiplier tube shown in FIG. 3 and the associated circuitry;

FIG. 7 is a schematic diagram of another version of a photomultiplier tube constructed according to the present invention which may be used in the oscilloscope constructed according to the present invention;

DETAILED DESCRIPTION OF PREFERRED EMBODIMENTS

The present invention is directed to an ultrafast sampling oscilloscope for generating and displaying time resolved profiles of ultraf at voltage pulses. The oscilloscope includes a photomultiplier tube which is constructed to include a photocathode which has a transmission strip line configuration and which is biased with the voltage pulse signal to be examined. The resolution of the oscilloscope of this invention is dictated by the spatial and temporal convolution of the voltage pulse signal that is applied to the photocathode in the photomultiplier tube as a bias voltage and a femtosecond light pulse that is also applied to the photocathode in the photomultiplier tube. Since the photoelectric phenomenon is instantaneous, the time response of this oscilloscope is approximately 130 femtoseconds (fs) for a 20 um beam size.

The construction and operation of a conventional photomultiplier tube and a photomultiplier tube according to this invention will first be described.

Figure 1:
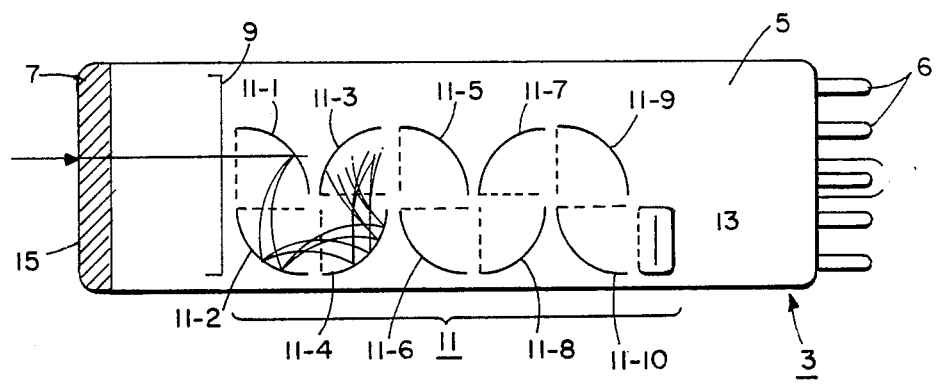
FIG. 1 is a simplified diagram of a conventional head-on type photomultiplier tube.
Figure 2:
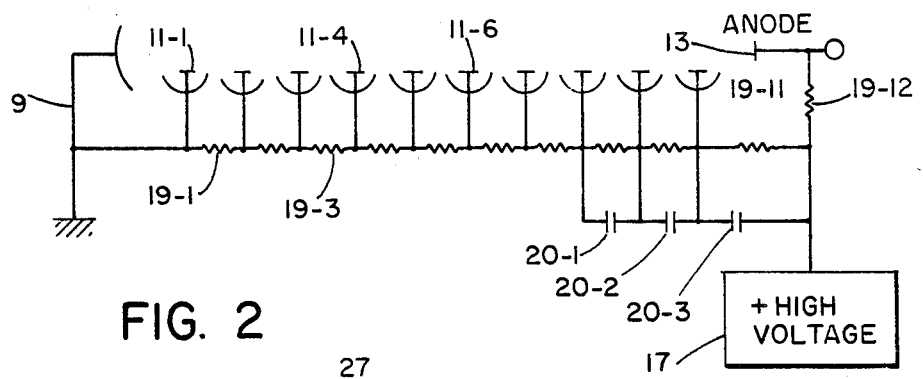
FIG. 2 is a schematic diagram illustrating the voltage-divider network in the photomultiplier tube shown in FIG. 1.

Referring now to the drawings, there is shown in FIG. 1a simplified cross-section view of one type of prior art photomultiplier tube, the tube being identified by reference numeral 3. Tube 3 includes an evacuated tubular housing 5 having, on the outside, a set of pins 6 and on the inside, a photocathode 7, an accelerating mesh 9, and an electron multiplier 11 in the form of a chain of dynodes 11-1 through 11-10 and an anode 13, the pins 6 being connected to the various components inside housing 5 by conductors (not shown). Photocathode 7 is in the form of a coating deposited on the inner surface of an entrance window 15 at the head of housing 5. For convenience, the circuitry for applying successively increased voltages to the electrodes and the accelerating mesh are not shown in FIG. 1 but, rather, are shown separately in FIG. 2. As can be seen in FIG. 2, the circuitry comprises a high voltage source 17, a plurality of series-connected resistors 19-1 through 19-12, and a plurality of capacitors 20-1 through 20-3.

Figure 3:
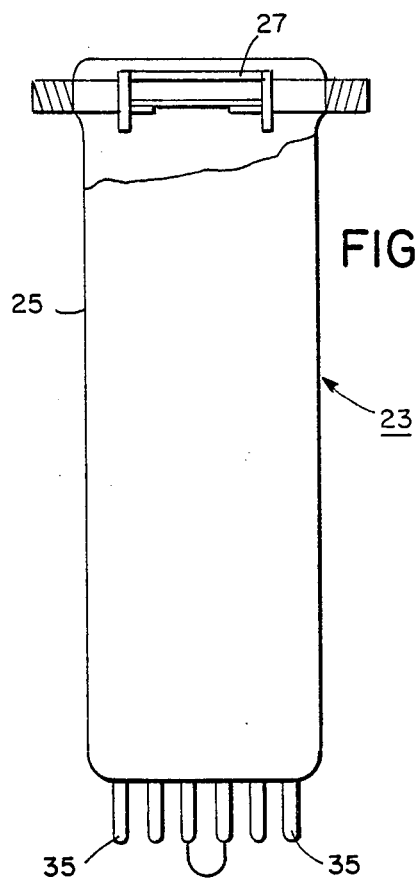
FIG. 3 is a front elevation view partly broken away in section of one embodiment of a photomultiplier tube constructed according to the teachings of the present invention for use in an oscilloscope constructed according to the teachings of the present invention.

Referring now to FIG. 3, there is shown a front elevation view of a photomultiplier tube constructed according to the teachings of this invention and identified by reference numeral 23. A simplified schematic of photomultiplier 23 and the associated circuitry is shown in FIG. 4.

Tube 23 comprises a tubular glass housing 25. Disposed inside of housing 25 are a variable aperture 26, a photocathode 27, an accelerating mesh 24 for accelerating electrons emitted by photocathode 27, a dynode chain comprising a plurality of dynodes 31-1 through 31-10 and an anode 33. Disposed outside of housing 25 are a set of pins 35 which are connected to the components inside housing 25 by conductors (not shown).

Figure 5A:
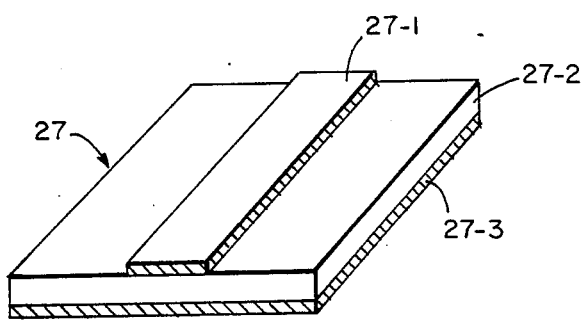
FIG. 5(a) is a perspective view of the photocathode shown in FIG. 3.

Housing 25, mesh 24, and dynode chain 31 are of the same construction as in a conventional photomultiplier tube. However, because the temporal width of the electrical pulses to be analyzed are in the extremely short picosecond to femtosecond range, it is necessary to modify the construction of the photocathode from the typical disc shaped configuration to a transmission line configuration which is much more capable of faithfully transmitting pulses of this limited duration. Accordingly, photocathode 27 is constructed in the transmission line configuration. In the embodiment shown in FIG. 4, the particular transmission line configuration employed is a microstrip line (see FIG. 5A) and includes a strip shaped upper conductor 27-1 made of a suitable photoconductive material, a substrate 27-2 of dielectric material underneath conductor 27-1 made of a suitable material such as glass and a lower conductor 27-3 below substrate 27-2, made of a suitable conductive material such as copper or gold. The type of material chosen for the upper conductor 27-1 is a determining factor in what frequency range the photomultiplier will respond to light radiation. Examples of some but not all of the photocathode materials that may be used for the upper conductor 27-1 and the frequency range to which they will respond are as follows: Sb—Cs, ultraviolet to visible; Ag—O—Cs, visible to 1000 nm; Sb—K—Cs, ultraviolet to visible; and Na—K—Sb—Cs, ultraviolet to near infrared. Microstrip 27 is designed for a 50 characteristic impedance $Z_o$ such that standard 50 ohm cables 29-1 and 29-2 connected to subminiature coaxial to strip line microwave launchers 31-1 and 31-2 can be used to electrically couple microstip 27 as will be hereinafter described.

Figure 5B:
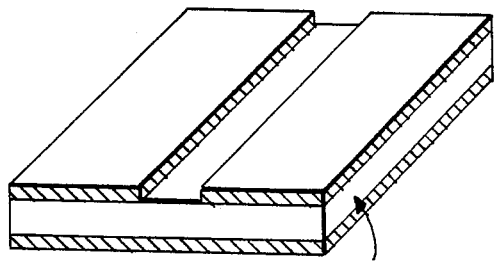
FIGS. 5B, 5C and 5D are perspective views of other photocathode configurations for the photomultiplier tube shown in FIG. 3.
Figure 5C:
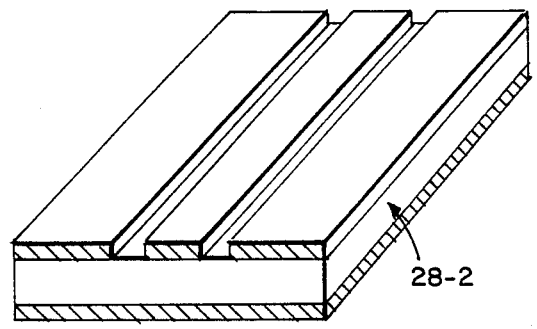
Figure 5D:
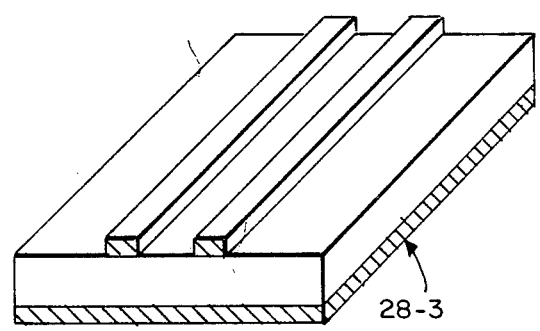

Other transmission line configurations that may be employed for the photocathode include the slotline 28-1 (FIG. 5B), the coplanar waveguide 28-2 (FIG. 5C), and coplanar strips 28-3 (FIG. 5D).

As will hereinafter be explained, the arrangement for biasing the photocathode relative to the anode in photomultiplier tube 23 is also very different than in a conventional photomultiplier tube.

As can be seen in FIG. 4, photocathode 27 is mounted between the two subminiature coaxial to strip line microwave launchers 31-1 and 31-2. In use, an optical beam 35 is focused by a lens 26 on the strip line 27 the size of the spot depending on the size of aperture 26 at the input of photocathode 27.

In the operation of photomultiplier tube 23, an electrical pulse $V(t)$ to be examined propagates through coaxial cable 29-1 ($Z_o=50$), across photocathode microstrip 27, through coaxial cable 29-2 ($Z_o=50$), and is then terminated through a 50 ohm resistor 37 to reduce reflection of this voltage. The 50 ohm resistor may be replaced with a 50 ohm coaxial cable which will allow constant monitoring of the electrical pulse $V(t)$ or permit its use in triggering other devices. The voltage pulse $V(t)$ propogating through photocathode 27 negatively biases photocathode 27 relative to accelerating mesh 24, which is grounded. Thus, when the optical and electrical pulses overlap in the strip line 27, the emitted electrons will travel towards accelerating mesh 24. The distance between mesh 24 and photocathode microstrip 27 is such that the electric field between them is strong enough to accelerate all the emitted electrons with the same initial velocity, thereby keeping them well bunched. The distance dc should be selected such that electrons will travel towards the mesh only when photocathode microstrip 27 is biased by voltage pulses $V(t)$. A high positive dc voltage 38 and voltage divider network 39 in the form of a plurality of resistors 40-1 through 40-3 and a load resistor 40-4 is used to negatively bias mesh 24 to anode 33 so that electrons reaching mesh 24 will be accellerated to anode 33.

Thus the bias produced by the voltage signal $V(t)$ will accelerate electrons from photocathode 27 to mesh 24 and the bias from the high voltage 38 will accellerate electrons from mesh 24 to anode 33.

The size of the adjustable aperture 26 will have an effect on the resolution of the system. For example, aperture diameters of 20 um, 10 um, 5 um, 100 um and 220 um will produce resolutions of 130 fs, 65 fs, 32 fs, 6.5 fs, 0.65 ps and 1.3 ps, respectively.

Figure 6:
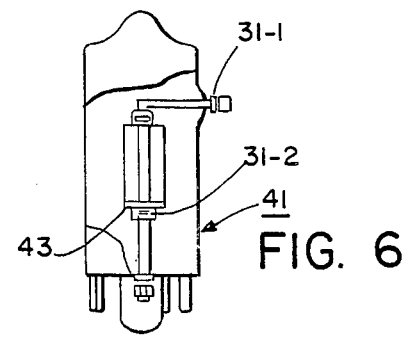
FIG. 6 is a front elevational view partly in section of another embodiment of a photomultiplier tube constructed according to the present invention which may be used in the oscilloscope constructed according to the present invention.

Another embodiment of a photomultiplier tube constructed according to this invention and identified by reference numeral 41 is shown in FIG. 6. In photomultiplier tube 41, photocathode 43 is in the form of a microstrip as in the FIG. 3 embodiment but is disposed for illumination from the side rather than from the top.

In FIG. 7 there is shown a schematic of another embodiment 51 of a photomultiplier tube constructed according to the teachings of the invention. In FIG. 7, the dynodes and voltage divider are replaced with a microchannel plate 44. Three dc voltage sources 45, 47, and 49 are used to guide the emitted electrons through microchannel plate 44 and to anode 33.

Figure 8:
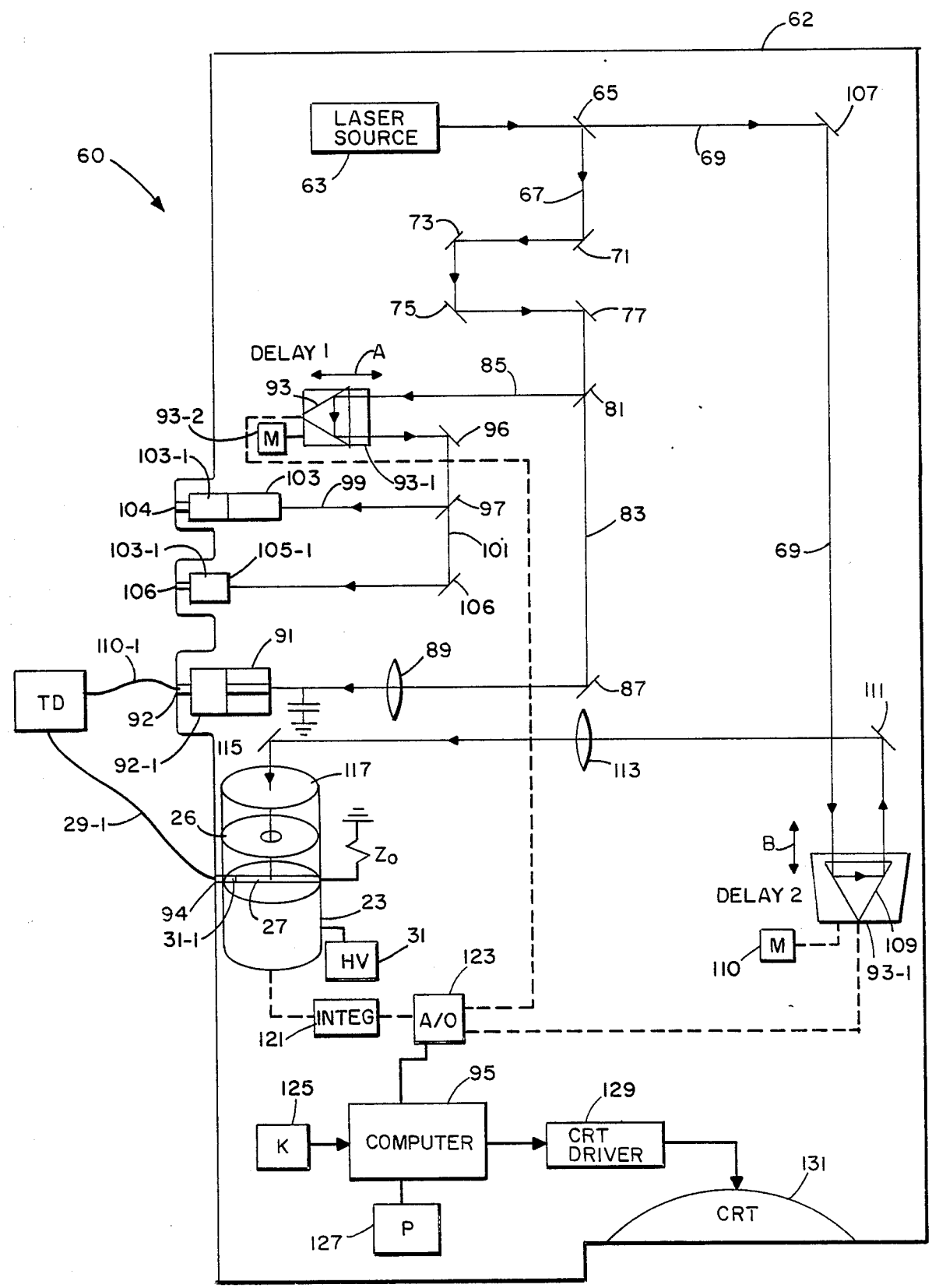
FIG. 8 is a schematic diagram of one embodiment of an oscilloscope constructed according to this invention.

Referring now to FIG. 8, there is schematically depicted a femtosecond sampling oscilloscope 60 constructed according to the teachings of this invention. For simplicity, parts of oscilloscope 60, not pertinent to the invention, such as the connections of certain components to appropriate power sources, are not shown.

Oscilloscope 60 is fully contained within a housing 62 and includes a femtosecond laser light source 63 which is used to generate optical pulses from 30 ps to 120 fs at 10 Hz to 100 Mhz. Laser light source 63 may be, for example a mode locked laser, such as Rhodamine Dye+DODC1 CPM, YAG, synchronously pumped dye or semiconductor laser. Oscilloscope 62 includes a photomultiplier tube 23.

A pulse of light from source 63 impinges on a beamsplitting mirror 65 where it is split into a reflected pulse and a transmitted pulse.

The reflected pulse $I(t)$ traveling along path 67 and having a pulse width $t_o$ is reflected off a set of mirrors 71, 73, 75, 77, which are used to increase the path length of reflected pulse 67. A beam splitter 81 splits reflected pulse $I(t)$ from mirror 77 into a transmitted pulse traveling along path 83 and reflected pulse traveling along path 85. A mirror 87 disposed along path 83 directs the transmitted pulse to a lens 89 which, in turn, focuses the transmitted pulse on a photoconductive switch (PCS) 91. PCS 91, which is disposed in close proximity to a first output port 92 formed in housing 62, converts the transmitted pulse into an electrical stimulus signal. The electrical stimulus signal is fed into first output port 92 through a variable attenuator 92-1 which allows the signal to be selectively adjusted in amplitude, as desired. The output signal at port 92 may be used to trigger an external device or for calibration purposes or for any other purpose desired.

An optical delay line 93 is disposed along the path of reflected pulse travelling along path 85. Optical delay line 93 is mounted on a support 93-1 which is movable in the direction shown by arrows A by a motor 93-2 controlled by a computer 95. Optical delay line 93 may for example, be a prism or a corner cube or a piezoelectric mirror. Motor 94 may be either a stepping motor if stepping movement is desired or an oscillating motor if a shaking type movement is desired. Upon emerging from delay line 93, the reflected pulse is reflected off a mirror 96 and then strikes a beam splitter 97 where it is split into a reflected pulse traveling along a path 99 and a transmitted pulse traveling along a path 101. Reflected pulse traveling along path 99 is used to trigger a pin diode 103, whose output is connected through a variable attenuator 103-1 to a second output port 104. The electrical signal output of pin diode 103 may be used for example to trigger an external electrical device, for calibration purposes or for any other desired purpose. The transmitted pulse traveling along path 101 is reflected off a mirror 105 through an optical attenuator 105-1 to a third output port 106. The signal at port 106 may be used to optically trigger an external device or for any other desired purpose. The time of arrival of the light pulse at pin diode 103 and port 106 may be varied by moving delay line 93.

Transmitted pulse $I(t+\tau)$, which is traveling along path 69, and which is ultimately bound for photocathode 27 in photomuliplier tube 23 beginning at a time $t+\tau$, emerges from beam splitter 65 having a pulse with $t_o$. A mirror 107 reflects the transmitted pulse and directs it towards a delay line 109. Delay line 109 which is identical to delay line 93 is mounted on a support 109-1 and movable by a motor 110 in the direction shown by arrows B to control the time at which the transmitted pulse $I(t+\tau)$ traveling along path 69 arrives at photocathode 27 in the photomultiplier tube 23.

An input port 94 is coupled through microwave launchers 29-1 to photocathode 27 in photomultiplier tube 23.

Thus, as can be seen, oscilloscope 62 has three output ports 92, 104 and 106 and one input port 94.

Oscilloscope 62 may be used, for example, to trigger the emission of a test voltage V(t) from a test device TD, the test voltage having a pulse width of $\Delta T_y$. To accomplish this, the output from an output port, such as port 92 is connected by a cable 110-1 to test device TD. The output test voltage signal V(t) from test device TD is conveyed by cable 29-1 to input port 94. From input port 94 the signal travels through microwave photocathode 27 via microwave launcher 29-1 where it biases photocathode 27 relative to mesh 24 beginning at time t.

Figure 9:
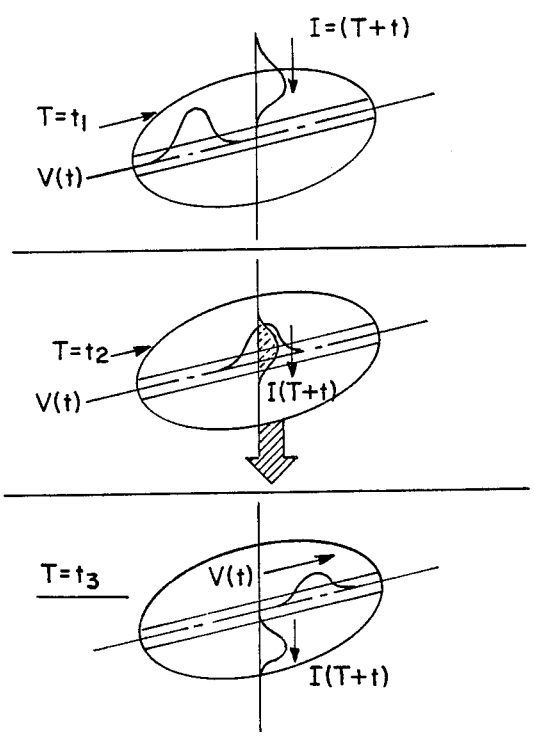
FIGS. 9(a) through 9(c) are schematic representations of the propagation of the voltage and optical pulses in the oscilloscope shown in FIG. 8 as they overlap in the photocathode in the photomultiplier tube.

As can be appreciated, electrons will be emitted from photocathode 27 and will propagate to dynode 31-1 of photomultiplier tube 23 only when voltage pulse V(t) and transmitted pulse $I(t+\tau)$ 69 overlap in space and time in photocathode 27. FIGS. 9(a) through 9(c) give a schematic representation of this process. The total number of electrons emitted from photocathode 27 is proportional to the amount of overlap of voltage pulse V(t) and transmitted pulse $I(t+\tau)$ 69. The amount of overlap of the two pulses, in turn, may be controlled by adjusting the amount of time delay between the two pulses using delay line 109.

Referring back to FIG. 8, the transmitted pulse $I(t+\tau)$ traveling along path 69 upon leaving delay line 109 is reflected off a mirror 111 passed through focusing optics 113, deflected off mirror 115, passed through front face 117 of tube 23, through variable aperture 26 and then, beginning at a time $t+\tau$, brought to focus on photocathode 27. In the manner discussed above, photomultiplier tube 23 will convert transmitted pulse $I(t+\tau)$ 69 into an electrical signal based on the characteristics of voltage pulse V(t) and on the temporal and spatial overlap of these pulses. This signal is transmitted from photocathode 27 to anode 33. From anode 33, the signal passes through a load resistor RL (shown in FIGS. 4 and 7) and on to an integrator 121, which processes the signal using a signal averager for more stability. The output of integrator 121 is fed into A/D converter 123 which converts the signal into digital information.

The digitized information from A/D converter 123 is sent to computer 95 where it is processed and stored. Instructions from a user may be entered into computer 95 from a keyboard 125. The processed information is either plotted on a plotter 127 and/or sent to a cathode ray tube CRT driver 129 which drives a CRT 131.

CRT 131 has its horizontal axis driven linearly with delay line 109 and its vertical axis driven by the output signal of tube 23 as processed by computer 93-1.

The signal $S(\tau)$ produced at delay time $\tau$: $S(\tau)$ as a result of test voltage pulse V(t) and the transmitted optical pulse $I(t+\tau)$ 69 copropogating through photocathode 27 to cause electrons to be emitted therefrom is given by the formula:

$$S_{(\tau)} = \int_{-\infty}^{\infty} k\, V(t)I(t+\tau)dt$$

where $S(\tau)$ is the signal from electrons emitted from photocathode 27 at the time $\tau$, K is the response of the photoelectric material on photocathode 27, V(t) is the test voltage pulse, and $I(t+\tau)$ is the transmitted optical pulse. Since the response of the photoelectric phenomena is instantaneous ($10^{-14}$s) the variable K is assumed constant and may be removed from inside the integral. Hence, $$S_{(\tau)} = k \int_{-\infty}^{\infty} V(t)I(t+\tau)dt$$

The emitted photoelectrons are accelerated by the electric field produced by V(t) striking the first dynode and producing secondary emissions. These secondary electrons then impinge upon subsequent dynodes to produce additional secondary electron emissions. Repeating this process over successive dynode stages, a high current amplification is achieved. This process is slow. The time response comes from overlap of V(t) and $I(t+\tau)$.

As is known, photomultiplier tubes or multichannel plate tubes have gains on the order of $10^4$ to $10^6$. The output signal of the photomultiplier tube is highly susceptible to fluctuations in the power supply voltage; hence, the power supply tube is for dynodes 2 to n should be very stable and exhibit minimum ripple, drift and temperature variation.

The current collected by the anode is in proportion to $S^1(\tau)$:

$$S^1(\tau) = GK \int_{-\infty}^{\infty} V(t)I(t + \tau)dt$$

where G is the gain ($10^2$–$10^7$) of the photomultiplier tube and $S^1(\tau)$ is the anode current. The anode current is sent through a load resistor R giving the following output voltage signal:

$$V_o(t) = RS^1(\tau) = RGK \int_{-\infty}^{\infty} V(t)I(t + \tau)dt = K \int_{-\infty}^{\infty} V(t)I(t + \tau)dt$$

Hence, the output signal $V_o(\tau)$ at $\tau$ is proportional to the test voltage pulse V(t) at $\tau$ times the gain of the photomultiplier.

If the width of the transmitted pulse 69, $\Delta t_o$, is less than the width of test voltage pulse V(t), $\Delta t_v$, i.e. $\Delta t_o << \Delta \tau_v$, then the test voltage pulse V(t) can be time resolved in the femtosecond range since this is the limit of the optical pulse width $\Delta t_o$. It should be noted that the time resolution of this technique does not depend upon the response time of photomultiplier 23 or the transit time (t) of the growing electron packet (current), but on the width of the transmitted optical pulse $\Delta t_o$.

The resolution of oscilloscope 62 is determined by the convolution time of transmitted optical pulse ($\tau_o$) and the traveling signal as they co-propagate through the photocathode material. Since the two signals travel orthogonal paths, the temporal resolution $\tau$ is the time it takes for the light pulse to transverse through the photocathode material convolved with the transit time of the electrical signal across the optical beam waist.

For a beam spot size of 20 um and a transmission strip line photocathode with a glass substrate (n=1.5; t=3.77) and a 50 ohm characteristic impedance Zo, the temporal resolution is 130 fs. The 20 um beam waist is obtained by the aperture in front of the photocathode, which also helps to reduce unwanted scattered light.

As can be appreciated, since test device TD is connected to oscilloscope 60 via conventional coaxial cables, the electrical stimulus signal from PCS 91 and the response signal (i.e. the test signal) of test device TD will be degraded as these electrical signals propagate through their respective cables and connectors. This degradation is due to dispersion. This problem of dispersion can be handled by encasing PCS 91, the sample site, and tube 23 is a cyrogenic unit and using nearly dispersionless transmission lines. This will, however, require a dewar, liquid helium, and a special cooling system. Another way to handle the dispersion problem is to use high temperature superconductive materials to fabricate dispersionless transmission lines and connectors. A third way to handle this is by building PCS 91, the sample holding site, and tube 23 all in close proximity. Hence, the response of the test device will have traveled only a few millimeters over a high-speed waveguide, suffering negligble dispersion. The advantge of this arrangement is that measurement can be performed accurately at room temperature.

Figure 10:
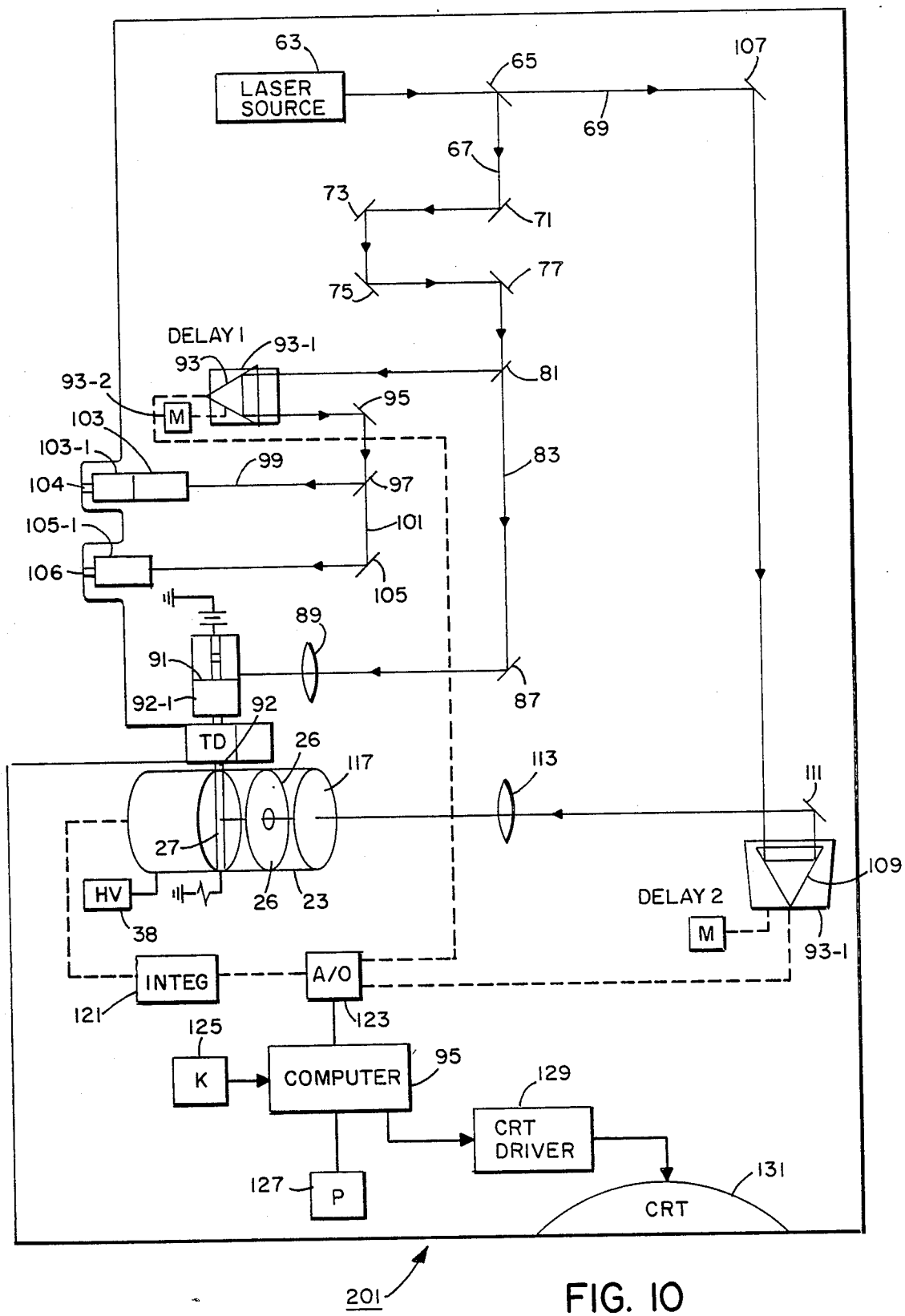
FIG. 10 is a schematic diagram of another embodiment of an oscilloscope constructed according to this invention.

An oscilloscope using the last noted solution is shown in FIG. 10 and identified by reference numeral 201. As can be seen the test device is positioned between output port 92 and input port 94 eliminating the need for connecting cables.

If desired, the oscilloscope could be provided with multiple inputs rather than a single input and the photomultiplier tube modified accordingly so as to handle multiple input signals. Also, more than three outputs could be easily provided by splitting the light pulse from source 63 into pulses traveling along more than three beam paths. Also, the output signal from port 104 or from port 92 could be connected directly to input port 94-2 for the purpose of calibrating the oscilloscope. Furthermore, a picosecond laser could be used in place of a femtosecond laser if only picosecond resolution is desired.

The various features and advantages of the invention are thought to be clear from the foregoing description. Various other features and advantages not specifically enumerated will undoubtedly occur to those versed in the art, as likewise will many variations and modifications of the preferred embodiment illustrated, all of which may be achieved without departing from the spirit and scope of the invention as defined by the following claims.

What is claimed is:

1. A sampling oscilloscope for time resolving picosecond voltage pulses with femtosecond resolution comprising:

(a) means for generating a femtosecond pulse of light,
   (b) means for splitting said femtosecond pulse of light into a plurality of pulses each traveling along a different beam path,
   (c) a first output port providing an output pulse signal related to the pulse of light traveling along a first one of the beam paths,
   (d) a photomultiplier tube having a photocathode, an accellerating mesh and an anode, the photocathode being positioned along a second one of the beam paths,
   (e) means negatively biasing the accellerating mesh relative to the anode,
   (f) an input port for receiving a picosecond voltage pulse to be time resolved, the input port being coupled to the photocathode, and
   (g) means coupled to the anode of the photomultiplier tube for displaying the voltage signal at the anode of the photomultiplier tube,
   (h) whereby, a picosecond voltage pulse may be applied to the input port to negatively bias the photocathode relative to the accellerating mesh producing a voltage signal at the anode of the photomultiplier tube when the picosecond voltage pulse and the light pulse traveling along the second path overlap in time and space on the photocathode.

2. The oscilloscope as recited in claim 1 and further comprising computer means coupled between said photomultiplier tube and said display means for processing and/or storing the output signal received from the photomultiplier tube.

3. The oscilloscope as recited in claim 2 and wherein said means for generating a femtosecond pulse of light comprises a femtosecond laser.

4. The oscilloscope as recited in claim 3 and wherein said means for displaying the output from the computer means includes a cathode ray tube.

5. The oscilloscope as recited in claim 4 and wherein said photocathode has a transmission line configuration.

6. A sampling oscilloscope for time resolving picosecond voltage pulses with femtosecond resolution comprising:
(a) a femtosecond laser for generating a femtosecond pulse of light,
(b) means for splitting said femtosecond pulse of light into a plurality of pulses each traveling along a different beam path,
(c) a first output port providing an output pulse signal related to the pulse of light traveling along a first one of the beam paths,
(d) a photomultiplier tube having a photocathode, an accelerating mesh and an anode, the photocathode having a transmission line configuration and being positioned along a second one of the beam paths,
(e) means negatively biasing the accellerating mesh relative to the anode,
(f) delay line means for delaying the time of arrival of the pulse traveling along the second beam path at the photomultiplier tube,
(g) an input port for receiving a picosecond voltage signal, the input port being coupled to the photocathode, and
(h) computer means coupled to the anode of the photomultiplier tube for processing and/or storing the signal received at the anode of the photomultiplier tube, and
(i) means including a cathode ray tube for displaying the picosecond signal processed and/or stored by the computer means,
(j) whereby, a picosecond voltage pulse may be applied to the input port to negatively bias the photocathode relative to the accellerating mesh producing an output signal at the anode of the photomultiplier tube when the picosecond voltage signal and the femtosecond light pulse traveling along the second path overlap in time and space on the photocathode.

7. The oscilloscope of claim 6 and further including second and third output ports for providing output pulse signals related to the pulse of light traveling along the first beam path.

8. The oscilloscope of claim 7 and wherein the output signal from the first output port is an electrical pulse signal.

9. The oscilloscope of claim 8 and wherein the output signal from the third output port is an optical pulse signal.

10. The oscilloscope of claim 9 and further including delay line means for delaying the time of arrival of the pulse traveling along the first beam path.

11. The oscilloscope of claim 6 and wherein the delay line means is movable.

12. The oscilloscope of claim 11 and further including attenuator means at the first output port for attenuating the first output signal.

13. The oscilloscope of claim 12 and further including means for moving the delay line means.

14. An oscilloscope for time resolving picosecond voltage pulses with femtosecond resolution comprising:
(a) means for generating a femtosecond pulse of light,
(b) means for splitting said femtosecond pulse of light into a plurality of pulses each traveling along a different beam path,
(c) a first output port providing an output pulse signal related to the pulse of light traveling along a first one of the beam paths,
(d) a photomultiplier tube having a photocathode, an accellerating mesh and an anode, the photocathode being positioned along a second one of the beam paths,
(e) means negatively biasing the accellerating mesh relative to the anode, (f) an input port for receiving a picosecond voltage pulse the input port being coupled to the photocathode, and
(g) a photoconductive switch at the first output port for receiving the light pulse traveling along the first beam path and outputting an electrical pulse,
(h) delay line means for delaying the time of arrival of the pulse traveling along the first beam path,
(i) means for moving the delay line means
(j) means coupled to the output of the photomultiplier tube for displaying the output at the anode of the photomultiplier tube,
(k) whereby, a picosecond voltage pulse may be applied to the input port to negatively bias the photocathode relative to the accellerating mesh producing an output signal at the anode of the photomultiplier tube when the picosecond voltage pulse and the light pulse traveling along the second path overlap in time and space on the photocathode.

15. The oscilloscope of claim 14 and wherein the photocathode is a microstrip.

16. The oscilloscope of claim 14 and wherein the means for moving the delay means comprises a stepping motor.

17. The oscilloscope of claim 16 and wherein the means for moving the delay means comprises an oscillating motor.

18. A sampling oscilloscope comprising:
(a) means for generating a pulse of light,
(b) means for splitting said pulse of light into a plurality of pulses each traveling along a different beam path,
(c) a first output port providing an output pulse signal related to the pulse of light traveling along a first one of the beam paths,
(d) a photomultiplier tube having a photocathode, an accellerating mesh and an anode, the photocathode being positioned along a second one of the beam paths,
(e) means negatively biasing the accellerating mesh relative to the anode,
(f) an input port for receiving a voltage signal, the input port being coupled to the photocathode, and
(g) means coupled to the output of the photomultiplier tube for displaying the signal at the anode of the photomultiplier tube,
(h) whereby, a voltage signal may be applied to the input port to negatively bias the photocathode relative to the accellerating mesh producing an output signal at the anode of photomultiplier tube when the voltage signal and the light pulse traveling along the second path overlap in time and space on the photocathode.

* * * * *